United States Patent

Visser

[11] Patent Number: 5,841,634
[45] Date of Patent: Nov. 24, 1998

[54] LIQUID-COOLED BAFFLE SERIES/PARALLEL HEAT SINK

[75] Inventor: Roy Alan Visser, Greentown, Ind.

[73] Assignee: Delco Electronics Corporation, Kokomo, Ind.

[21] Appl. No.: 815,545

[22] Filed: Mar. 12, 1997

[51] Int. Cl.$^6$ ....................................................... H05K 7/20
[52] U.S. Cl. .......................... 361/699; 361/689; 361/704; 361/698; 257/706; 257/714; 174/15.1; 174/16.3; 165/80.4; 165/80.5; 165/104.33; 165/185
[58] Field of Search ..................................... 361/699, 689, 361/702, 704, 698; 257/706, 714; 174/15.1, 16.3; 165/80.4, 80.5

[56] References Cited

U.S. PATENT DOCUMENTS

| | | | |
|---|---|---|---|
| 3,361,195 | 1/1968 | Meyerhoff et al. | 165/80 |
| 5,159,529 | 10/1992 | Lovgren et al. | 361/699 |
| 5,265,670 | 11/1993 | Zingher | 165/80.4 |
| 5,316,075 | 5/1994 | Quon et al. | 165/80.4 |
| 5,444,295 | 8/1995 | Lake et al. | 257/678 |
| 5,563,447 | 10/1996 | Lake et al. | 257/724 |
| 5,666,269 | 9/1997 | Romero et al. | 361/699 |
| 5,675,473 | 10/1997 | McDunn et al. | 361/699 |

Primary Examiner—Leo P. Picard
Assistant Examiner—Boris L. Chervinsky
Attorney, Agent, or Firm—Jimmy L. Funke

[57] ABSTRACT

A liquid-cooled heat-sink including a cooling housing defining a cooling chamber where the chamber is positioned adjacent to a semi-conductor device or devices to be cooled. An inlet port introduces a liquid coolant into the chamber and an exit port removes the liquid coolant from the chamber. A single unit plastic baffle is positioned within the chamber. The baffle includes strategically configured plenums, jet ports and transfer ports that direct the liquid coolant in both a series and parallel manner for increased cooling efficiency. The jet ports direct the liquid coolant onto the semiconductor devices in a parallel manner, and liquid coolant is transferred from one set of jets to another set of jets in a series manner.

18 Claims, 9 Drawing Sheets

LIQUID-COOLED BAFFLE SERIES/PARALLEL HEAT SINK

BACKGROUND OF THE INVENTION

1. Field of the Invention

This invention relates generally to a liquid-cooled heat sink for a semiconductor device and, more particularly, to a liquid-cooled heat sink for a semiconductor device or devices that includes a baffle for directing the cooling fluid in both a series and parallel direction.

2. Discussion of the Related Art

Semiconductor devices generate heat during their operation. This heat usually acts to degradate the operation of the semiconductor device. For high power semiconductor devices, it is necessary to cool the device during operation to maintain acceptable device performance. High power semiconductor devices include power transistors that are used, for example, as inverters in electric vehicles to convert DC battery voltage to AC voltage suitable to operate the electric motors associated with the vehicle. Typically, several inverters of this type are necessary in modern day electric vehicles. A discussion of such inverters can be found in U.S. Pat. No. 5,444,295 titled "Linear Dual Switch Module," and U.S. Pat. No. 5,563,447 titled "High Power Semiconductor Switch Module," both assigned to the assignee of the instant application, and herein incorporated by reference.

Techniques for removing heat from a semiconductor device typically involves convection and/or conduction. In one known semiconductor device cooling technique, convecting fins are attached to a semiconductor package housing the semiconductor device, or the package is affixed to a larger metal member, referred to as a heat sink. It has also heretofore been known to integrate a heat sink into the semiconductor package. This heat sink draws heat away from the semiconductor device and can be air cooled or liquid cooled, depending on the particular application. If the heat sink is air cooled, the heat sink would typically have heat convecting fins.

It is known that liquid cooling is more effective than air cooling for removing heat from a semiconductor device. In one example of liquid cooling, a coolant is directed through a passage or passages in the heat sink. If the heat sink is integrated into a semiconductor device package, the cooling liquid could be directed over or through the heat sink. Ordinarily, direct contact between the coolant and the semiconductor device within the package is avoided.

A problem typically exists with liquid cooling a semiconductor device in that stagnation of the coolant liquid at the heat sink/coolant interface occurs, which reduces the effectiveness of heat transfer. This stagnation typically refers to coolant speed near the cooled heat sink surface that is slower than required to adequately remove heat from the heat sink surface. Hence, its rate of cooling is less than the rate at which heat arrives at that surface, which causes an accumulation of heat at the surface. In order to reduce this effect, the speed of the flow of the coolant can be increased. However, this ordinarily would entail a high capacity and/or higher pressure pump, and a coolant flow system that can withstand the higher pressures. Such enhancements may not be practical, and even if practical, will conceivably involve cost increases that are commercially significant.

One example of a higher cost, higher pressure liquid cooling system involves spraying the coolant against the heat sink surface from a nozzle under sufficient pressure to reduce or eliminate stagnation. The spray system reduces stagnation at a relatively high cost. In addition, the size of the total system is enlarged over low pressure liquid cooling to accommodate the added system components. Accordingly, these types of spray systems are primarily used where higher cost and size can be justified.

U.S. Pat. No. 5,316,075 discloses a liquid-cooled heat sink. The heat sink has a simple planar baffle with only one inlet plenum and one outlet plenum. Additionally, all of the plume or jet producing holes within the baffle are in parallel. A number of disadvantages exist with this approach. For example, because all of the jet producing holes are in parallel, the liquid flow through these parallel plumes is not equal. Additionally, the simple parallel baffle requires a very high flow rate to achieve adequate average flow in the jet producing holes. This flow rate requires a larger, more expensive pump, even though the back pressure across the baffle is low.

What is needed is a liquid-cooled heat sink that solves the stagnation problems in the prior art, but does not involve higher pressures, greater component size, and increased cost. It is therefore an object of the present invention to provide such a heat sink.

SUMMARY OF THE INVENTION

In accordance with the teachings of the present invention, a liquid-cooled heat-sink is disclosed that includes a housing defining a cooling chamber where the chamber is positioned adjacent to a semiconductor device or devices to be cooled. An inlet port introduces a liquid coolant into the chamber and an exit port removes the liquid coolant from the chamber. A baffle is positioned within the chamber. The baffle includes strategically configured plenums, jet ports, and transfer ports that direct the liquid coolant in both a series and parallel manner for increased cooling efficiency at relatively low pump pressures.

In one particular embodiment, the baffle includes a horizontal plate that separates the baffle into a series of three top plenums and a series of three bottom plenums separated by dividing walls. A first bottom plenum is in fluid communication with the inlet port and with a first top plenum by a first set of jet ports. The first top plenum is in fluid communication with a second bottom plenum by a first transfer port. The second bottom plenum is in fluid communication with a second top plenum by a second set of jet ports. The second top plenum is in fluid communication with a third bottom plenum by a second transfer port. The third bottom plenum is in fluid communication with a third top plenum by a third set of jet ports. And, the third top plenum is in fluid communication with the outlet port through a third transfer port. Liquid coolant introduced into a chamber travels in parallel through the sets of jet ports, and in series through the transfer ports.

In another particular embodiment, a heat-sink housing includes three side-by-side chambers separated by dividing walls. A separate semiconductor module to be cooled is positioned over each chamber. Each chamber includes a separate baffle of the type discussed above. Liquid coolant is introduced through an inlet port in one chamber. Port holes in the dividing walls direct the coolant from chamber to chamber. An outlet port is connected to the last chamber to remove the coolant from the housing.

Additional objects, advantages, and features of the present invention will become apparent from the following description in appending claims, taken in conjunction with the accompanying drawings.

DETAILED DESCRIPTION OF THE PREFERRED EMBODIMENT

The following discussion of the preferred embodiments directed to a liquid-cooled heat sink for a semiconductor device including a baffle and associated package is merely exemplary in nature and is in no way intended to limit the invention or its applications or uses.

Figure 1:
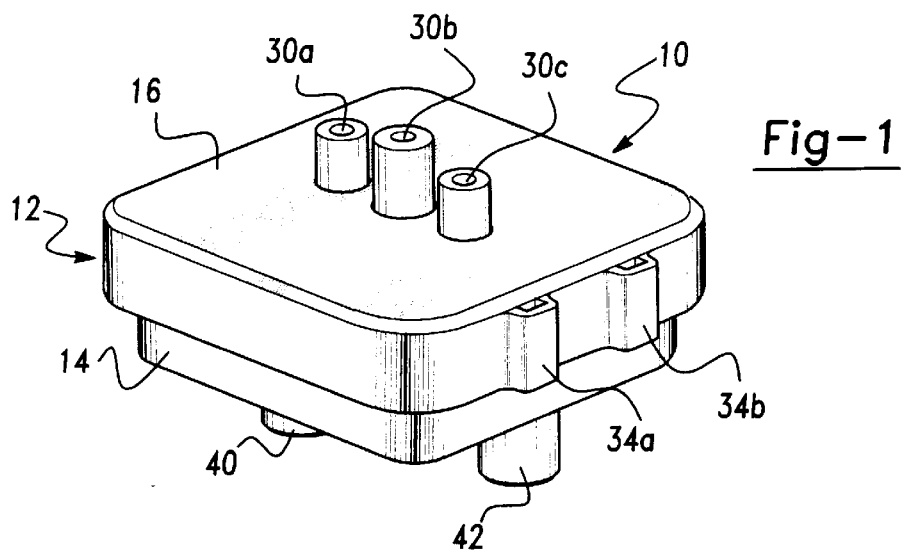
FIG. 1 is a perspective view of a liquid-cooled, high power linear dual switch module including a heat-sink baffle according to an embodiment of the present invention.
Figure 2:
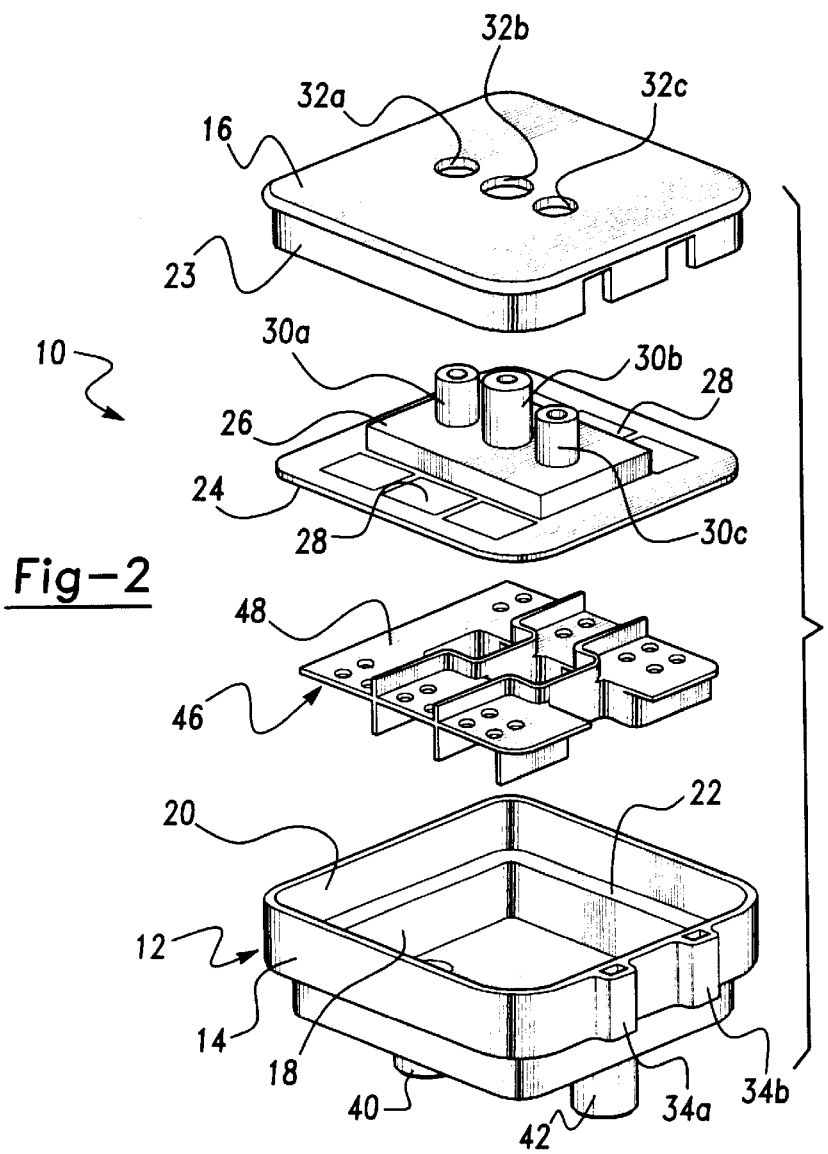
FIG. 2 is an exploded perspective view of the high power linear dual switch module shown in FIG. 1 showing the baffle according to the present invention.

FIG. 1 shows a perspective view and FIG. 2 shows an exploded perspective view of a high power linear dual switch module 10. The dual switch module 10 is part of an inverter that incorporates high power solid state transistors used to convert DC battery voltage to AC power in an electric vehicle operable to run a three-phase electric motor. To provide full three-phase power, three silicon dies are used for each power transistor and two transistors make up a half-bridge for one phase of the inverter. Six transistors or eighteen silicon dies make up a full bridge for all three phases. High power linear dual switch modules of the type of the module 10 are known in the art, and can be found, for example, in U.S. patent Ser. Nos. 08/118,112 and 08/117,924, referenced above.

The module 10 includes a plastic housing 12 defined by a housing base portion 14 and a cover 16. The plastic making up the housing 12 can be any suitable engineering grade thermoplastic, such as a polypropolene, or any other plastic suitable for the intended purpose. The housing base portion 14 is separated into a lower cooling chamber portion 18, and an upper device chamber portion 20, defining a shoulder 22 therebetween. The cover 16 includes an extending wall 23 that extends into the upper chamber portion 20, and the cover 16 is adhered to the base portion 14 at the mating surfaces with the wall 23 by using an adhesive, solvent welding compound or the like.

A device substrate plate 24 is positioned within the upper chamber portion 20, and rests on the shoulder 22. In one embodiment, the plate 24 is about 115 millimeters long, 111 millimeters wide, and 2–4 millimeters thick. The substrate plate 24 supports a terminal plate subassembly 26 surrounded by a plurality of semiconducted devices 28. Each of the semiconductor devices 28 is a silicon die where three devices 28 make up one power transistor. Three aligned power terminals 30a, 30b, and 30c are connected to the terminal plate subassembly 26, and extend out of openings 32a, 32b, and 32c, respectively, in the cover 16. The operation of the substrate plate 24, subassembly 26, and power terminals 30a, 30b, 30c can be found in Ser. No. 08/118,112 referenced above. A pair of enlarged portions 34a and 34b extend from the base portion 14, and house a group of control and diagnostic terminals for the semiconductor devices 28 within the housing 12.

The plate 24 is preferably made of a high thermal conductivity material that has a thermal expansion coefficient near that of silicon. If the plate 24 has nearly the same coefficient of expansion as silicon, thermal stresses between the plate 24 and the semiconductor devices 28 can be reduced. Special metals can be used for the plate 24 that have a thermal expansion coefficient close to that of silicon and can be, for example, FERNICO, KOVAR, INVAR and the like. In addition, certain ceramics such as aluminum oxide could be used that have a coefficient of expansion substantially the same as that of silicon. However, typically ceramics have various drawbacks, such as lower thermal conductivities than are desirable. Preferably, composite materials are used for the plate 24. These composite materials can be laminated or assembled by other constructions. Such materials are more desirable for the plate 24 because they are designed to have a thermal expansion characteristic matching silicon, and yet have a relatively high thermal transfer for properties. One particular attractive composite is a metal/ceramic composite, such as MCX-693 available from Lanxide Corporation of Newark, Del. The periphery of the plate 24 is bonded throughout its contact area with the shoulder 22 in a manner that forms a seal between the plate 24 and the base portion 14. Because the housing 12 expands at a higher rate than the plate 24, thermal expansion compensation is provided between them. This thermal expansion compensation is provided in the form of a flexible silicon adhesive to bond the plate 24 to the housing 12.

Because the module 10 includes several high power semiconductor devices 28 packaged in close proximity in the housing 12, it is necessary that the plate 24 be cooled to increase the performance of the semiconductor devices 28. To provide this cooling function, a liquid coolant is introduced into the lower chamber portion 18 through an inlet port 40 to contact a bottom surface of the plate 24 so as to remove heat. The heated coolant then exits the lower chamber portion 18 through an exit port 42. The liquid coolant can be any suitable coolant known in the art for the purposes described herein, such as a 50/50 mixture of automotive antifreeze and water. Suitable tubing and pump components (not shown) are connected together to cause the liquid coolant to flow into the inlet port 40. A typical coolant flow rate would be from 2–4 gallons per minute and preferably three gallons per minute. These components are not shown in this diagram, but as would be appreciated by those skilled in the art, they can be any appropriate pumping system that is conventional for the purposes described herein.

For inverter modules of the type being discussed herein for electric vehicles, it is desirable to maintain a particular coolant flow into and out of the chamber portion 18 that provides the desired back pressure, i.e., the power required to move the coolant for a given flow rate, versus the thermal heat removal performance of the cooling system. Further, it is desirable to use relatively inexpensive pumps that can provide the desirable back pressure. To maintain a suitable back pressure using pumps of this type, there is a tradeoff in that thermal performance may not be optimum.

Figure 3:
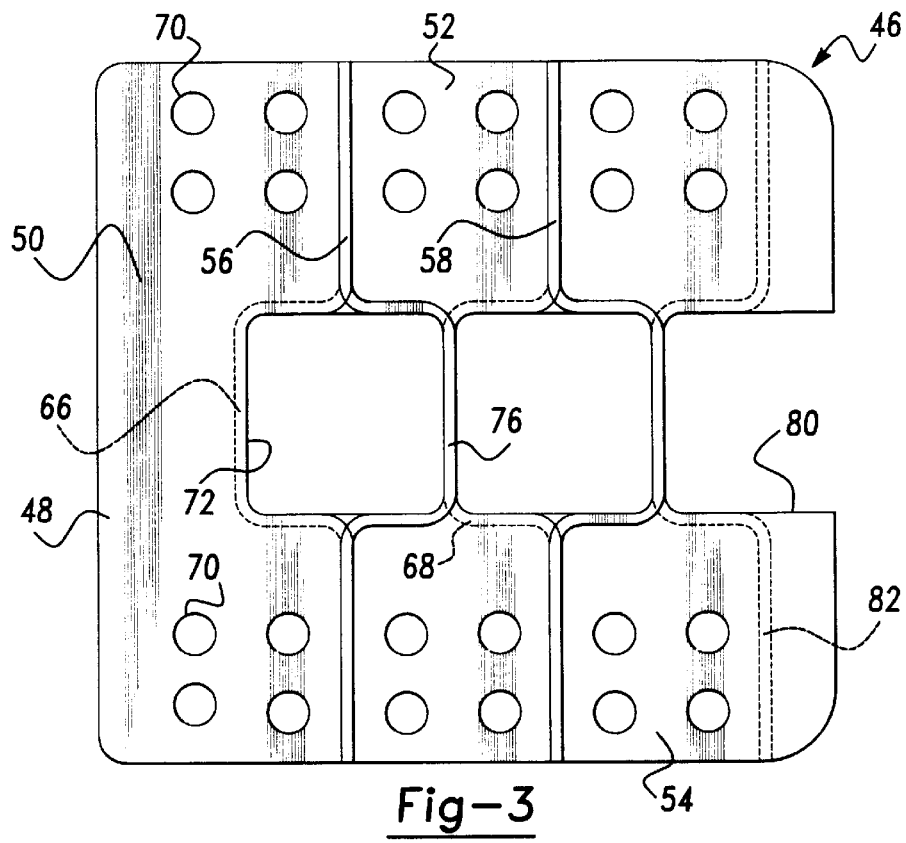
FIG. 3 is a top view of the baffle shown in FIG. 2 separated from the module.
Figure 4:
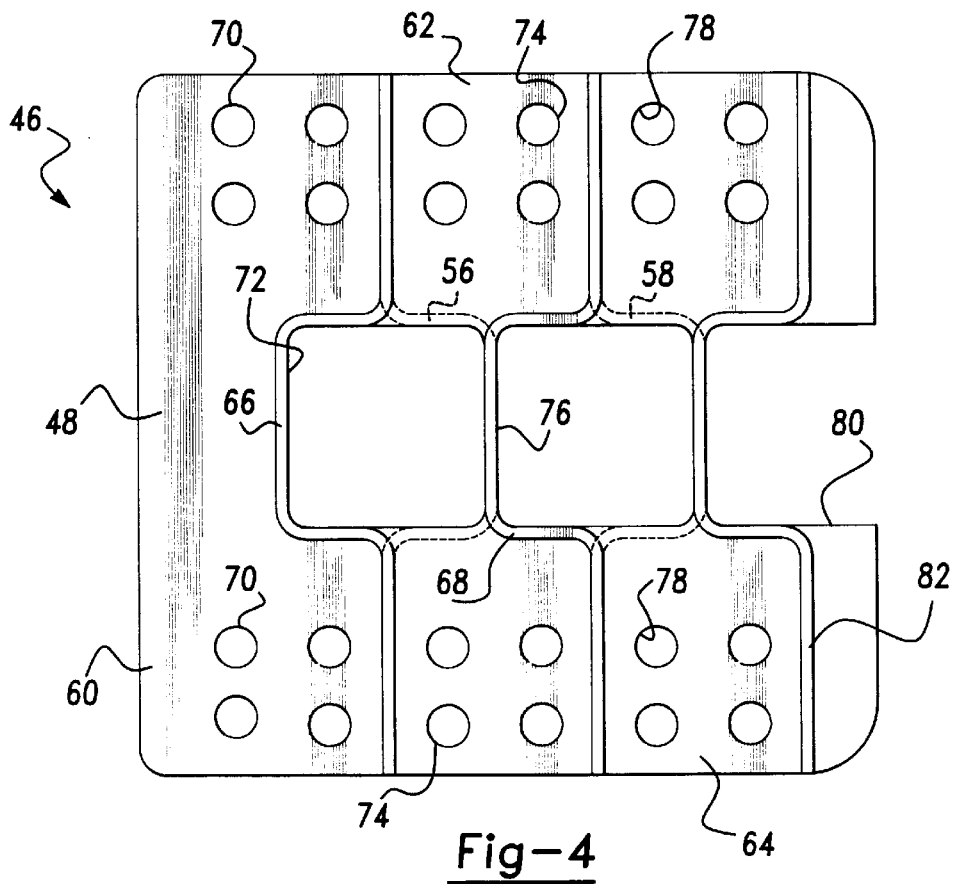
FIG. 4 is a bottom view of the baffle shown in FIG. 2 separated from the module.

In order to realize the most effective cooling at relatively low pumping pressures, a baffle 46 is provided, according to an embodiment of the present invention, that provides a number of desirable coolant flow characteristics within the lower chamber 18 to achieve this result. FIG. 3 shows a top view of the baffle 46, and FIG. 4 shows a bottom view of the baffle 46 separated from the housing 12. In one embodiment, the baffle 46 is a single piece plastic member, made of a suitable engineering grade thermoplastic, that is molded into the shape as shown to provide the desirable coolant flow direction and rate within the chamber portion 18. Although the baffle 46 is made of a plastic material resistant to heat, coolant and the environment of the system, it is within the scope of the invention to provide other types of material for the baffle 46, such as aluminum.

As will be discussed below, the baffle 46 includes a series of plenums, jets and ports that provide both parallel and series flow of the coolant within the chamber portion 18, so as to provide an adequate flow cross-section in a limited space for effective cooling. Particularly, the baffle 46 includes a horizontal plate 48 that separates the baffle 46 into a series of three top plenums and a series of three bottom plenums. The series of top plenums includes a first top plume plenum 50, a second top plume plenum 52 and a third top plume plenum 54. The first top plenum 50 is separated from the second top plenum 52 by a first top omega-shaped separating wall 56, and the second top plenum 52 is separated from the third top plenum 54 by a second top omega-shaped separating wall 58. The series of bottom plenums includes a first bottom plume plenum 60, a second bottom plume plenum 62, and a third bottom plume plenum 64. The first bottom plenum 60 is separated from the second bottom plenum 62 by a first bottom omega-shaped separating wall 66, and the second bottom plenum 62 is separated from the third bottom plenum 64 by a second bottom omega-shaped separating wall 68.

The first bottom plenum 60 is in fluid communication with the first top plenum 50 by a first set of eight plume jet ports 70. The first top plenum 50 is in fluid communication with the second bottom plenum 62 by a first transfer port 72. The second bottom plenum 62 is in fluid communication with the second top plenum 52 by a second set of eight plume jet ports 74. The second top plenum 52 is in fluid communication with the third bottom plenum 64 by a second transfer port 76. The third bottom plenum 64 is in fluid communication with the third top plenum 54 by a third set of eight plume jet ports 78. And, the third top plenum 54 is in fluid communication with the outlet port 42 through a third transfer port 80. A third bottom omega-shaped separating wall 82 prevents the coolant traveling through the third transfer port 80 from entering the third bottom plenum 64.

As discussed above, each set of jet ports includes eight circular ports. Tests were conducted to determine the best possible flow characteristics for the back pressure versus thermal performance requirements of the desirable system. Each set of ports includes four ports on each side of a transfer port. Each set of four ports is positioned directly under a semiconductor device 28. In one embodiment, the diameter of each port is 0.219 inches to allow a 0.19 inch diameter solid particle to pass. However, the size of the port can vary between one-eighth of an inch and three-eights of an inch and still be effective. Eight ports was selected as being the most effective for the purposes described herein. As will be appreciated by those skilled in the art, other number of ports and different sized and shaped ports can be incorporated into the baffle 46 without departing from the spirit and scope of the invention.

In one embodiment, the baffle 46 is about 3.83 inches long and about 3.71 inches wide. The length of each plenum is about 1.10 inches. The distance between the centers of adjacent jet ports in one series of jet ports in a length direction is about 0.48 inches, and the distance between the centers of adjacent jet ports in a transverse direction is about 0.40 inches. Each transfer port is about 1.08 inches wide and 1.04 inches long. The top separating walls are about 0.22 inches high and the bottom separating walls are about 0.52 inches high. The shorter top separating walls allow the jet ports to be closer to the plate 24 for increased cooling. Of course, these dimensions are given by way of example in that other dimensions may be equally applicable.

Figure 5:
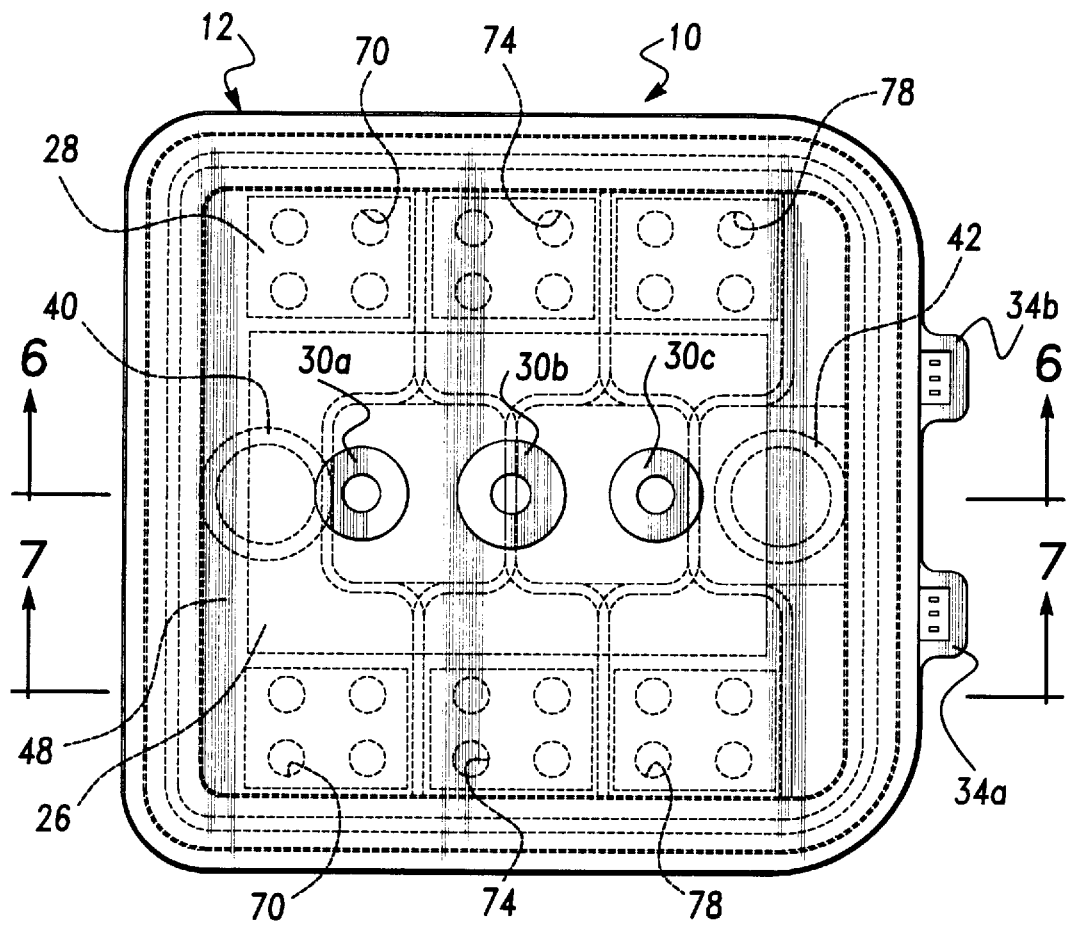
FIG. 5 is a top view of the module shown in FIG. 1.
Figure 6:
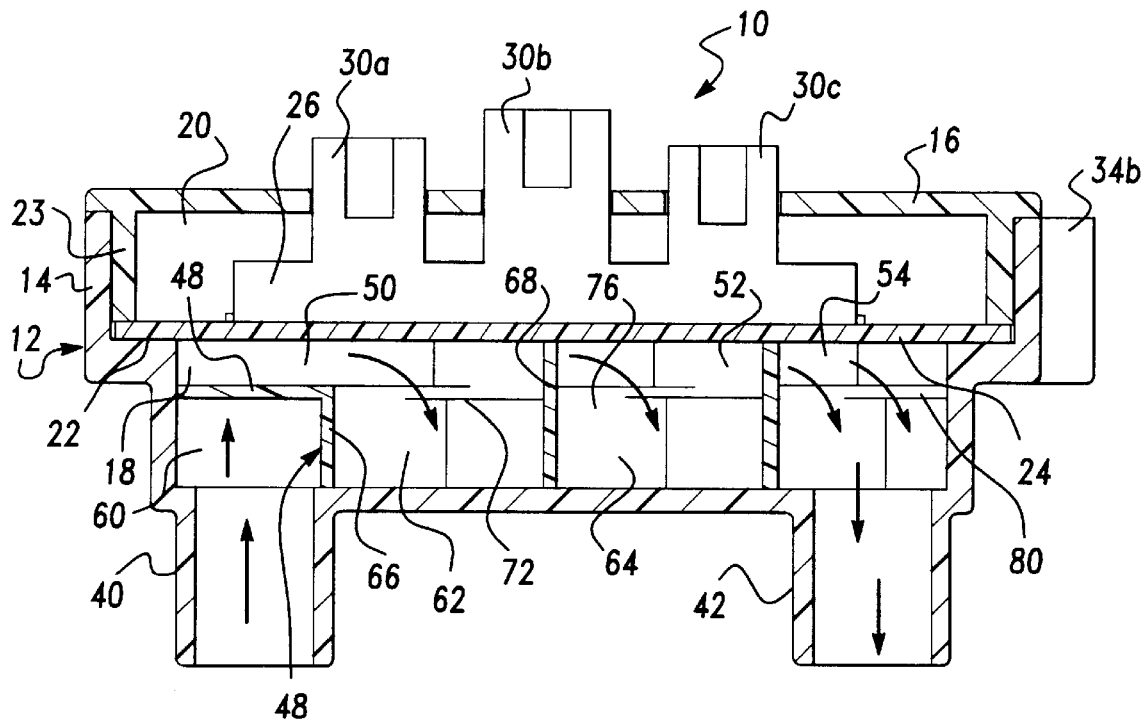
FIG. 6 is a cross-sectional view through line 6—6 of the module shown in FIG. 5.
Figure 7:
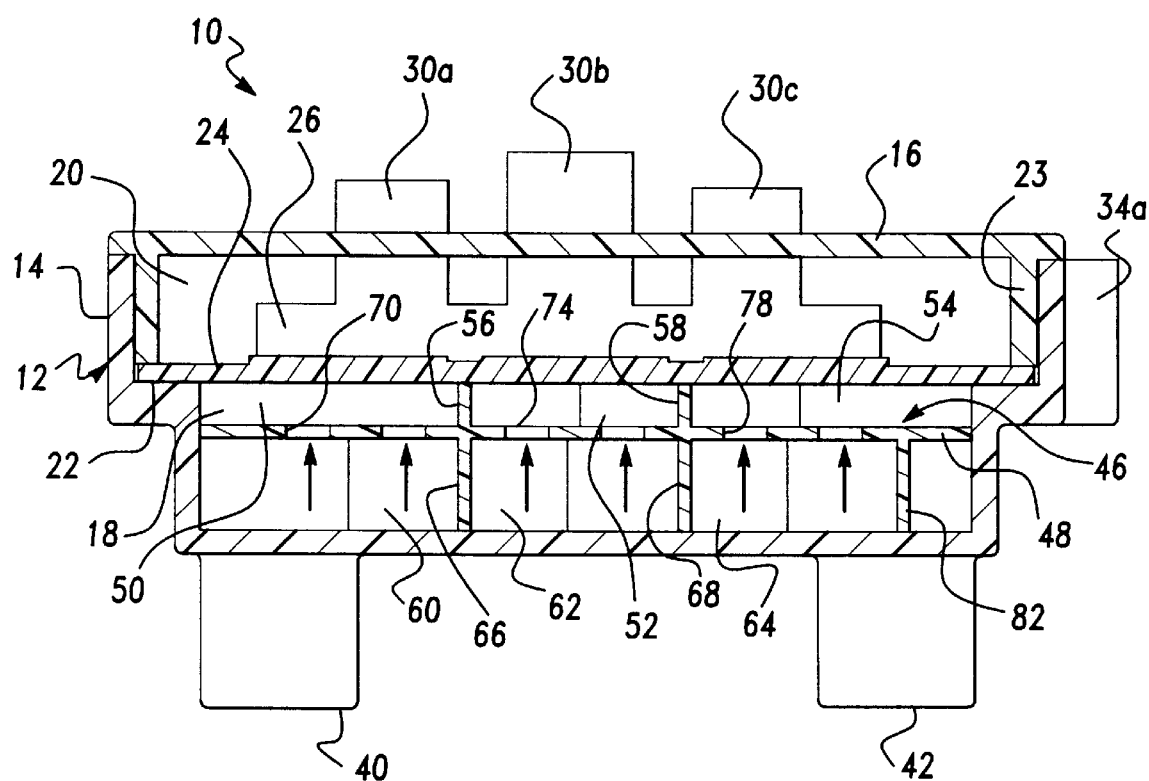
FIG. 7 is a cross-sectional view through lines 7—7 of the module shown in FIG. 5.

FIG. 5 shows a top view of the module 10. FIG. 6 shows a cross-sectional view through line 6—6 of FIG. 5, and FIG. 7 shows a cross-sectional view through line 7—7 of FIG. 5 to help give an understanding of the liquid coolant flow in the lower chamber portion 18 around the different plenums of the baffle 46. Liquid coolant enters the lower chamber portion 18 through the inlet port 40 into the first bottom plenum 60. From the bottom plenum 60, the liquid coolant is forced upward through the first set of jet ports 70 into the first top plenum 50 to contact the bottom surface of the plate 24 in a substantially vertical direction. The liquid coolant in the first top plenum 50 then flows into the second bottom plenum 62 through the first transfer port 72. From the second bottom plenum 62, the liquid coolant is forced upward through the second set of jet ports 74 into the second top plenum 52 to again contact the bottom surface of the plate 24. The liquid coolant then flows from the second top plenum 52 through the second transfer port 76 into the third bottom plenum 64. From the third bottom plenum 64, the liquid coolant is forced upward through the third set of jet ports 78 into the third top plenum 54 to once again contact the bottom surface of the plate 24. From the third top plenum 54, the liquid coolant exits the chamber portion 18 through the third transfer port 80 out of the exit port 42.

The configuration of the baffle 46 and the flow of the liquid coolant as just described provides a unique coolant flow for increased thermal performance. By providing the separate sets of jet ports and the separate plenums as discussed, the liquid coolant flows in a parallel manner simultaneously through each of the sets of jet ports 70, 74, and 78, thus giving a series/parallel flow of the liquid coolant in the baffle 46. The parallel flow of the liquid coolant comes from the simultaneous flow of the coolant through the jet ports 70, 74, and 78, and the series flow of the liquid coolant comes from the flow of the coolant from plenum to plenum. This flow of coolant in the baffle 46 gives uniform cooling for each semiconductor device 28. The jet ports 70, 74 and 78 create sufficient turbulence for increased cooling performance. Also, the baffle 46 provides a low pressure drop between the inlet port 40 and the outlet port 42.

Figure 8:
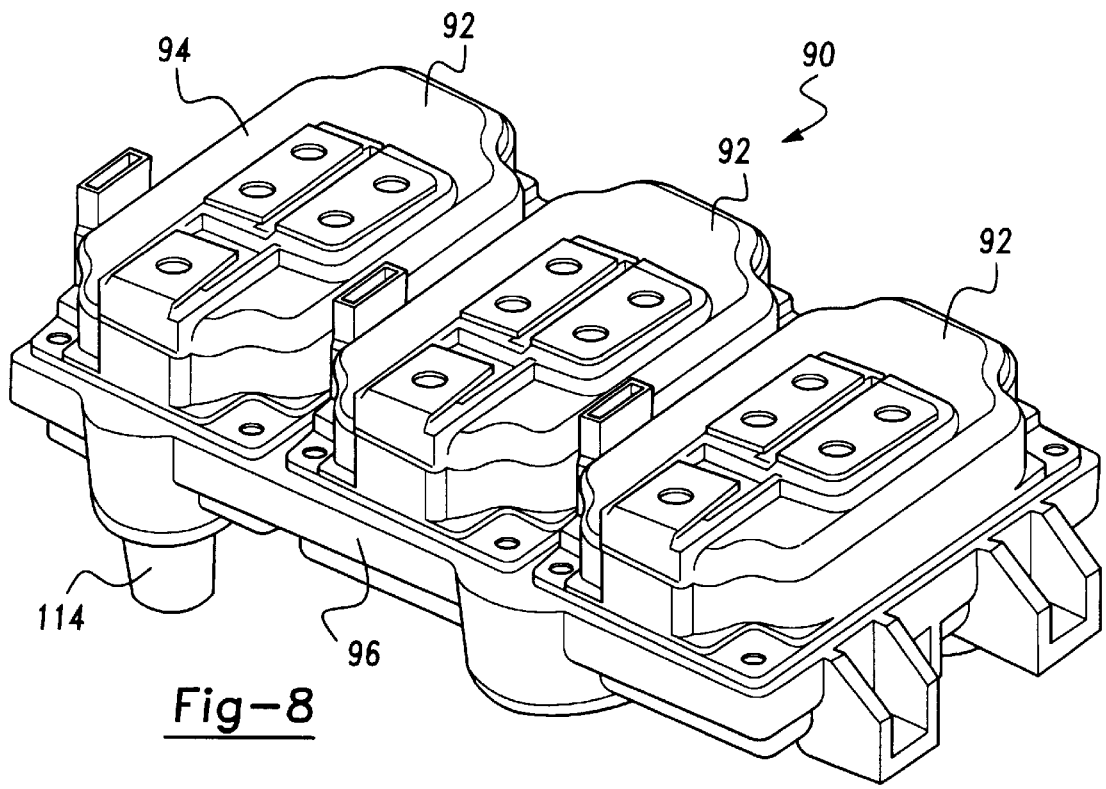
FIG. 8 is a top perspective view of a liquid-cooled, full bridge, ganged transistor module including a heat-sink baffles according to another embodiment of the present invention.
Figure 9:
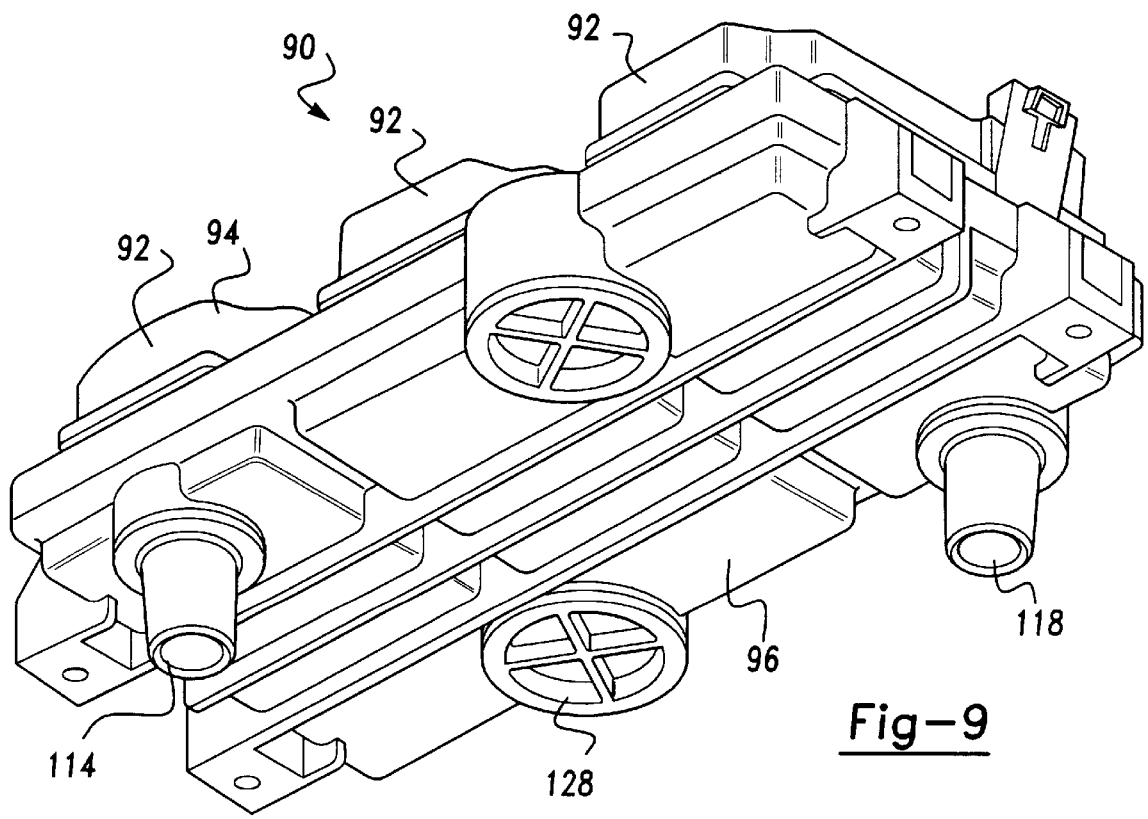
FIG. 9 is a bottom perspective view of the module shown in FIG. 8.

FIG. 8 shows a top perspective view and FIG. 9 shows a bottom perspective view of a ganged power transistor module 90. The module 90 includes three submodules 92 that each enclose semiconductor devices (not shown) and other associated circuitry of the type discussed above. Each submodule 92 is the equivalent of the module 10 above. Thus, each submodule 92 includes two power transistors having three silicon dies each. The module 90 is thus a full bridge three-phase inverter. Each of the submodules 92 have plastic covers 94 that are bolted to a single plastic heat-sink housing 96 that houses a liquid cooling system (discussed below) to cool the semiconductor devices within the submodules 92 to increase their performance. The configuration and operation of the submodules 92 is conventional in the art, and need not be discussed here for the purposes of the present invention.

Figure 10:
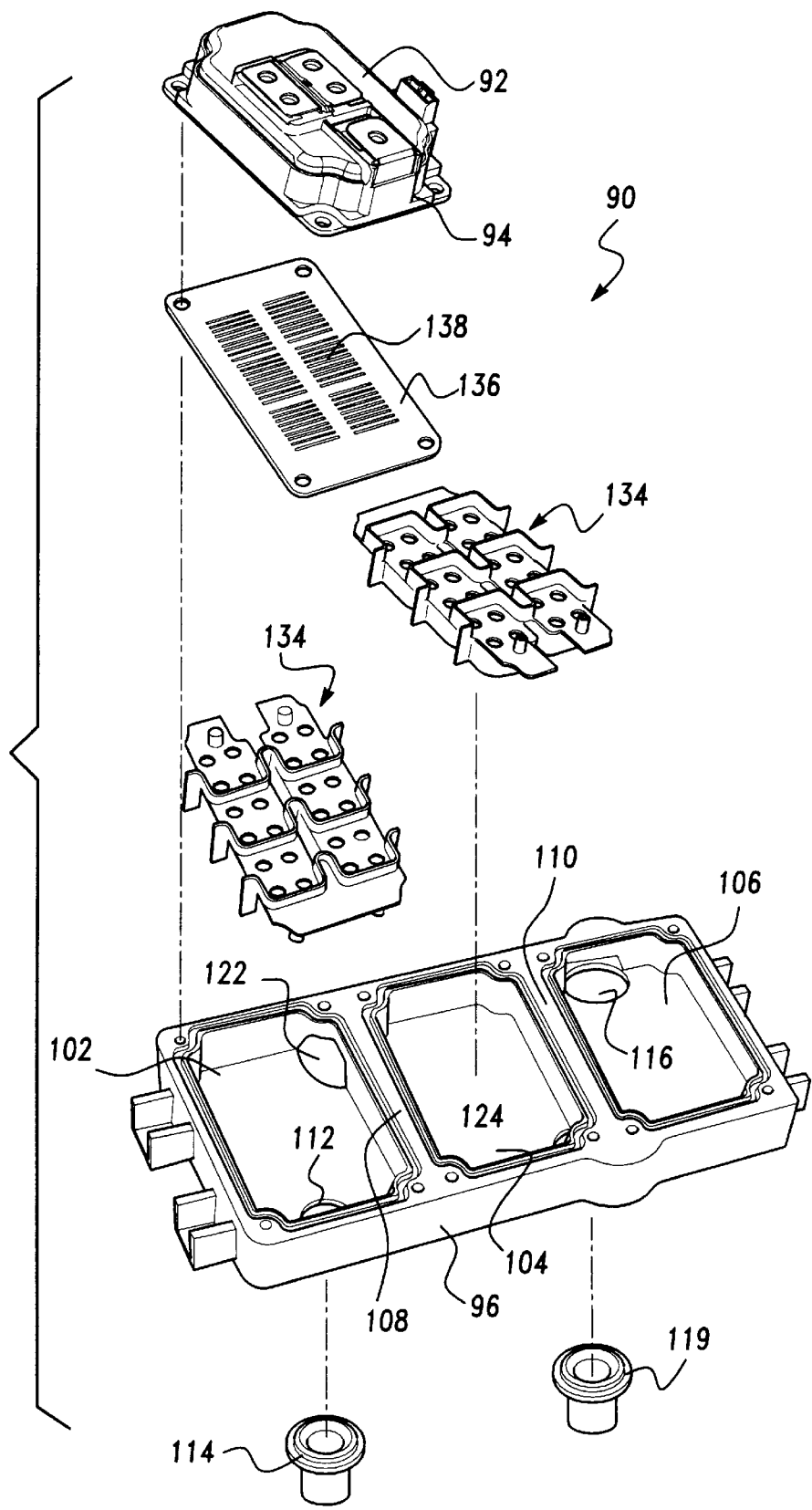
FIG. 10 is a blown apart perspective view of some of the components of the module shown in FIG. 8 depicting the baffle of the invention.

FIG. 10 shows a partially exploded perspective view of the module 90. The heat-sink housing 96 includes three side-by-side cooling chambers 102, 104, and 106. Each cooling chamber 102, 104, and 106 is associated with a separate submodule 92 such that the submodule 92 is bolted directly above its chamber. The cooling chamber 102 is separated from the cooling chamber 104 by a first dividing wall 108, and the second chamber 104 is separated from the third chamber 106 by a second dividing wall 110. An inlet port 112 is in fluid communication with the chamber 102 and is connected to an inlet nipple 114. An exit port 116 is in fluid communication with the chamber 106, and is connected to an exit nipple 118. The chamber 102 is in fluid communication with the chamber 104 by a side port 122 in the wall 108, and the chamber 104 is in fluid communication with the chamber 106 by a side port 124 in the wall 110. A pair of plugs 126 and 128 are welded to the housing 96 directly below the side ports 124 and 122, respectively.

Figure 13:
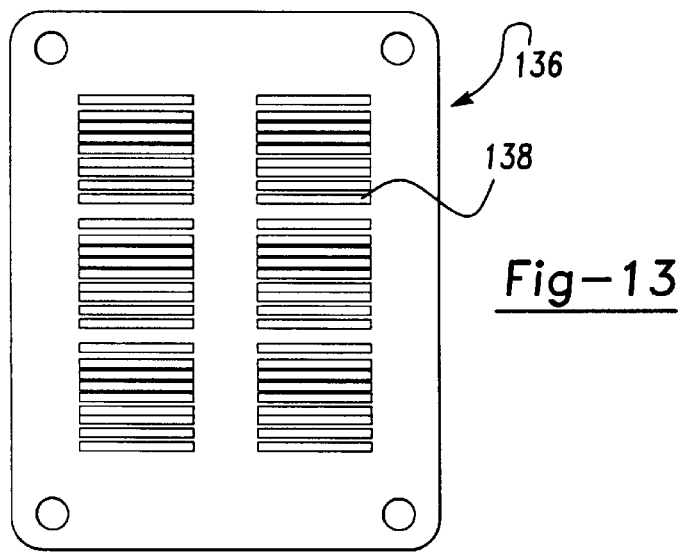
FIG. 13 is a top view of a heat sink plate associated with the module of FIG. 10.

Each of the chambers 102, 104, and 106 includes a baffle 134, according to an embodiment of the present invention, and a backplate 136. The semiconductor devices within each of the submodules 92 are positioned on the backplate 136 as with the plate 24 above. The opposite side of the backplate 136 is positioned adjacent to the baffle 134. The backplate 136 includes a series of slot indentations 138 projecting towards the chamber to provide more surface area and help draw heat away from the backplate 136 when it is in contact with the coolant flow. FIG. 13 shows the backplate 136 separated from the submodule 92. Liquid coolant flowing around the baffle 134 contacts the backplate 136 and draws heat away from the semiconductor devices in the submodule 92.

Figure 11:
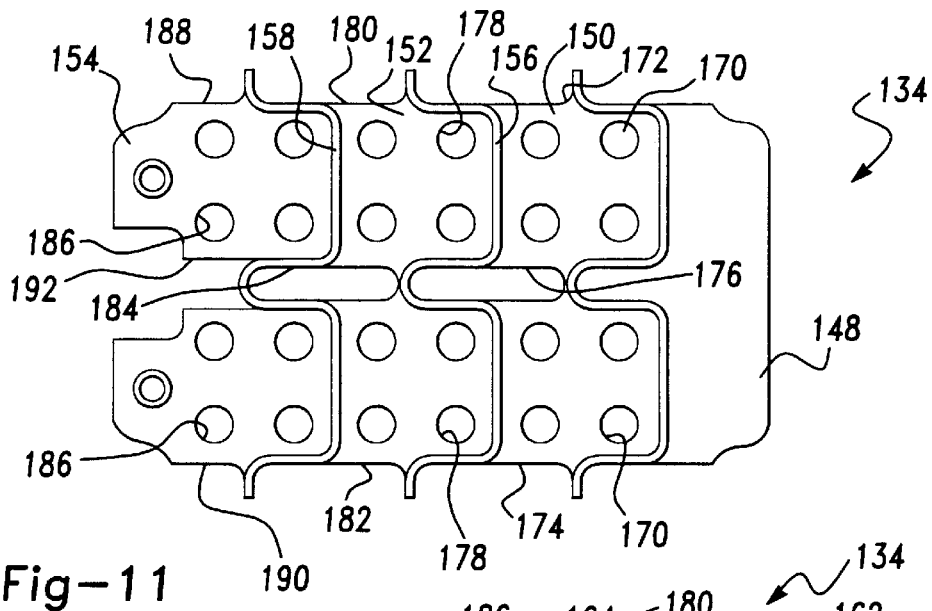
FIG. 11 is a top view of the baffle shown in FIG. 10 separated from the module.
Figure 12:
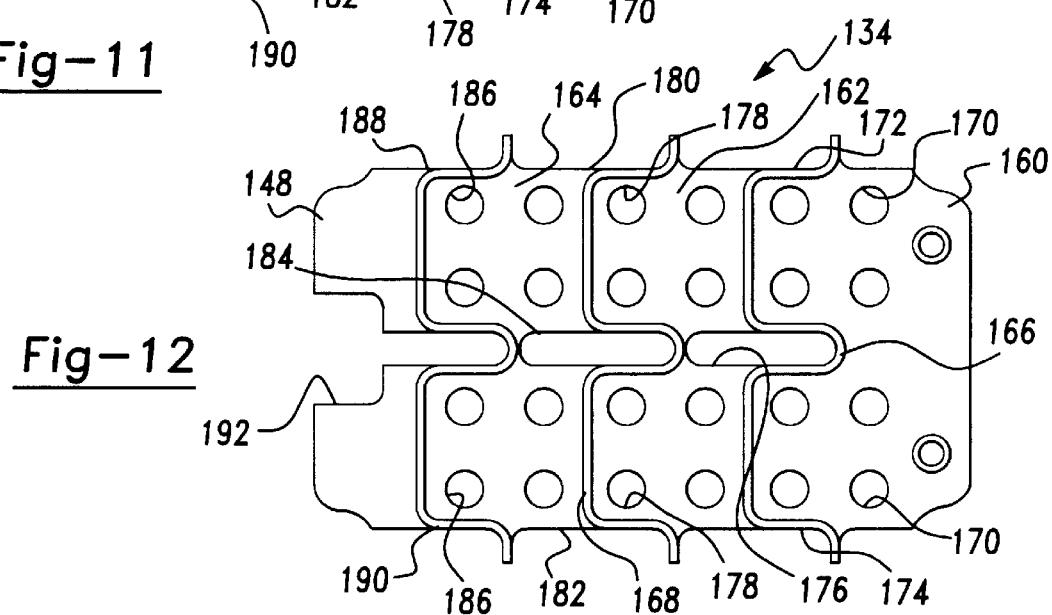
FIG. 12 is a bottom view of the baffle shown in FIG. 10.

FIG. 11 shows a top view and FIG. 12 shows a bottom view of one of the baffles 134 that is positioned within the chambers 102, 104, and 106. The baffle 134 is very similarly configured to the baffle 46 discussed above and operates in substantially the same manner. Particularly, the baffle 134 includes a horizontal plate 148 that separates the baffle 134 into a series of three top plenums and a series of three bottom plenums. The series of top plenums includes a first top plume plenum 150, a second top plume plenum 152 and a third top plume plenum 154. The first top plenum 50 is separated from the second top plenum 52 by a first top separating wall 156, and the second top plenum 152 is separated from the third top plenum 154 by a second top separating wall 158. The series of bottom plenums include a first bottom plume plenum 160, a second bottom plume plenum 162, and a third bottom plume plenum 164. The first bottom plenum 160 is separated from the second bottom plenum 162 by a first bottom separating wall 166, and a second bottom plenum 162 is separated from the third bottom plenum 164 by a second bottom separating wall 168.

The first bottom plenum 160 is in fluid communication with the first top plenum 150 by a first set of eight plume jet ports 170. The first top plenum 150 is in fluid communication with the second bottom plenum 162 by first side transfer ports 172 and 174, and a first middle transfer port 176. The reason that the side transfer ports are required in the baffle 134 and not in the baffle 46 discussed above is because the size of the chambers 102, 104, and 106 do not allow the middle transfer port to be wide enough to combine with the properly dimensioned two sets of four plume jet ports, to maintain the desired coolant flow rate. As discussed above, each set of four jet ports are positioned directly below a semiconductor device. The second bottom plenum 162 is in fluid communication with the second top plenum 152 by a second set of eight plume jet ports 178. The second top plenum 152 is in fluid communication with the third bottom plenum 164 by second side transfer ports 180 and 182, and a second middle transfer port 184. The third bottom plenum 164 is in fluid communication with the third top plenum 154 by a third set of eight plume jet ports 186. And, the third top plenum 154 is in fluid communication with either one of the side ports 122 or 124, or the output port 116 depending on which chamber 102, 104, and 106 the baffle 134 is in, through third side transfer ports 188 and 190 and a third middle transfer port 192. A third bottom dividing wall 194 prevents the coolant from entering the third bottom plenum 164 from the third top plenum 154.

The baffle 134 is about 3.92 inches long and about 2.39 inches wide. The top dividing walls are about 0.22 inches high and the bottom dividing walls are about 0.60 inches high. The side transfer ports and the middle transfer ports are about 0.98 inches long and about 0.19 inches wide.

Figure 14:
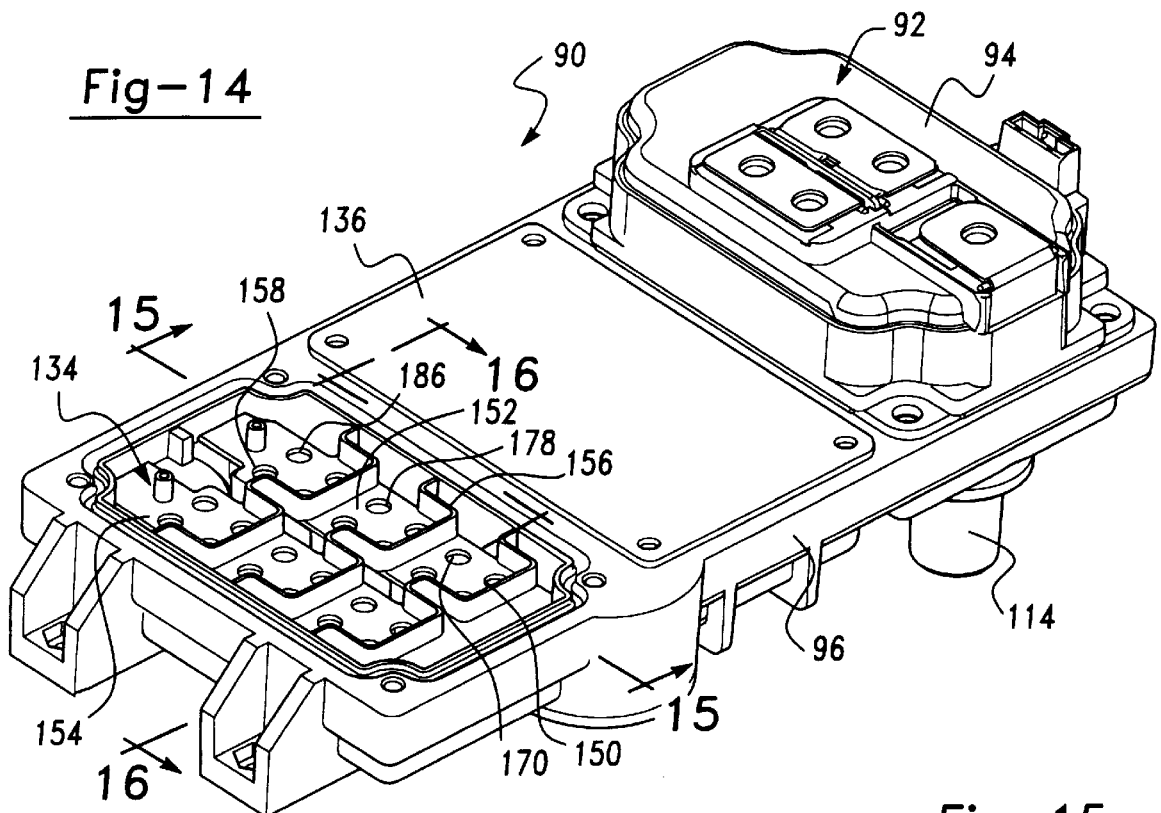
FIG. 14 is a partial perspective view of the module shown in FIG. 10.
Figure 15:
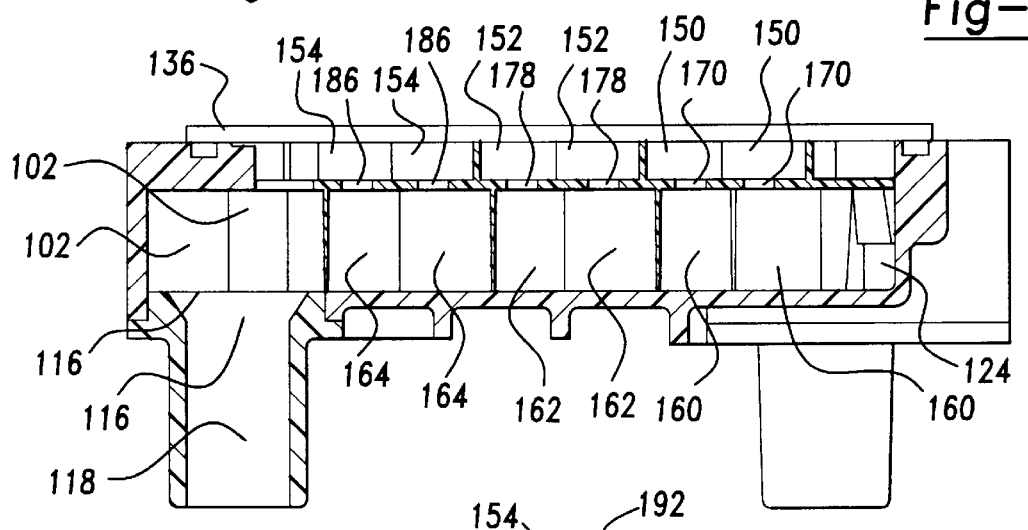
FIG. 15 is a cross-sectional view through line 15—15 of the module shown in FIG. 14.
Figure 16:
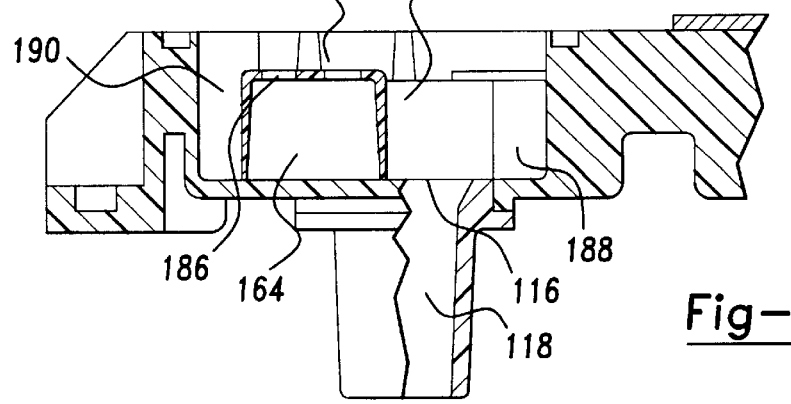
FIG. 16 is a cross-sectional view through line 16—16 of the module shown in FIG. 14.

FIG. 14 shows a top perspective view of the module 90 with two of the submodules 92 missing. FIG. 15 shows a cross-sectional view through line 15—15 of the module 90 shown in FIG. 14, and FIG. 16 shows a cross-sectional view through line 16—16 of the module 90 shown in FIG. 14. Liquid coolant enters either the chamber 102, 104, or 106 through the inlet port 112, or one of the side ports 122 and 124, into the first bottom plenum 160. From the bottom plenum 160, the liquid coolant is forced upward through the first set of jet ports 170 into the first top plenum 150 to contact the bottom surface of the plate 134 in a substantially vertical direction. The liquid coolant in the first top plenum 150 then flows into the second bottom plenum 162 through the first side transfer ports 172 and 174 and the first middle transfer port 176. From the second bottom plenum 162, the liquid coolant is forced upward through the second set of jet ports 178 into the second top plenum 152 to again contact the bottom surface of the plate 136. The liquid coolant then flows from the second top plenum 152 through the second side transfer ports 180 and 182 and the second middle transfer port 76 into the third bottom plenum 164. From the third bottom plenum 164, the liquid coolant is forced upward through the third set of jet ports 186 into the third top plenum 154 to once again contact the bottom surface of the plate 134. From the third top plenum 154, the liquid coolant flows through the third side transfer ports 188 and 190 and the third middle transfer port 192 to exit the chamber 102 through the side port 112, the chamber 104 through the side port 128, or the chamber 106 through the exit port 116.

Figure 17:
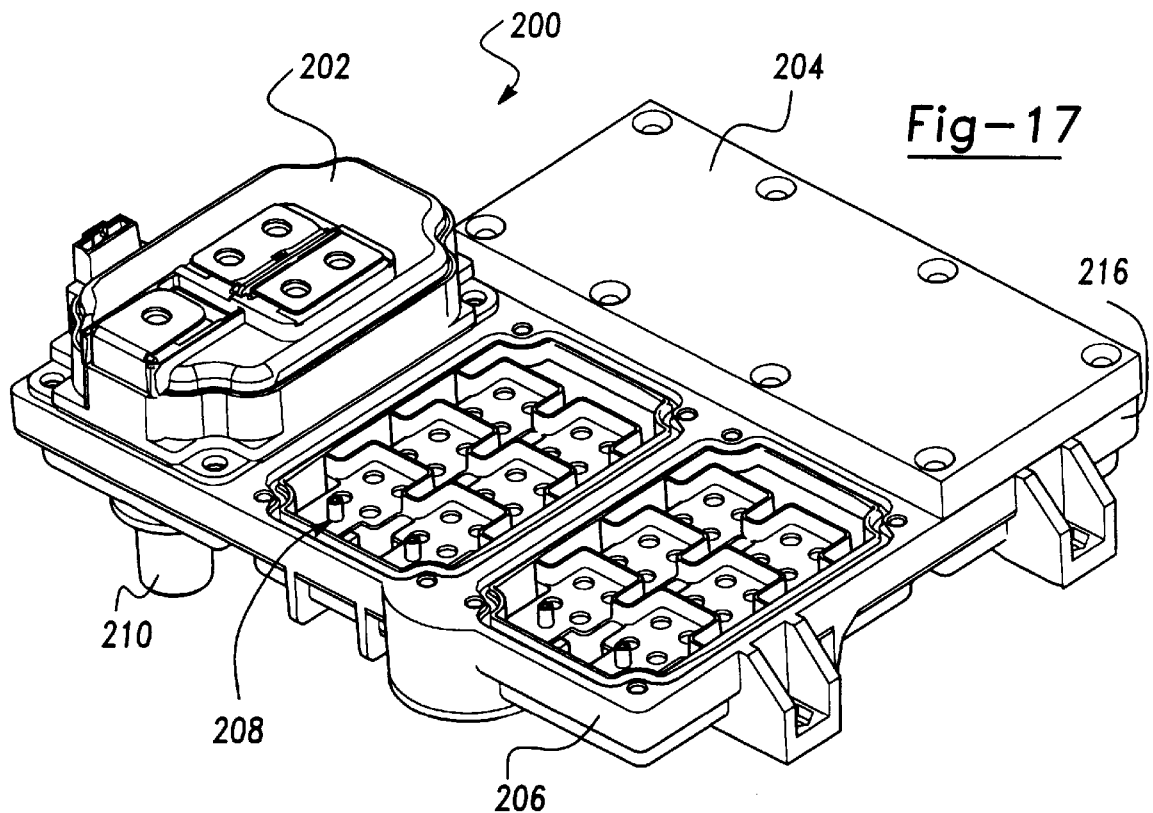
FIG. 17 is a partial perspective view of yet another liquid-cooled, ganged high power transistor module including an auxiliary coldplate and incorporating the baffle according to the present invention.
Figure 18:
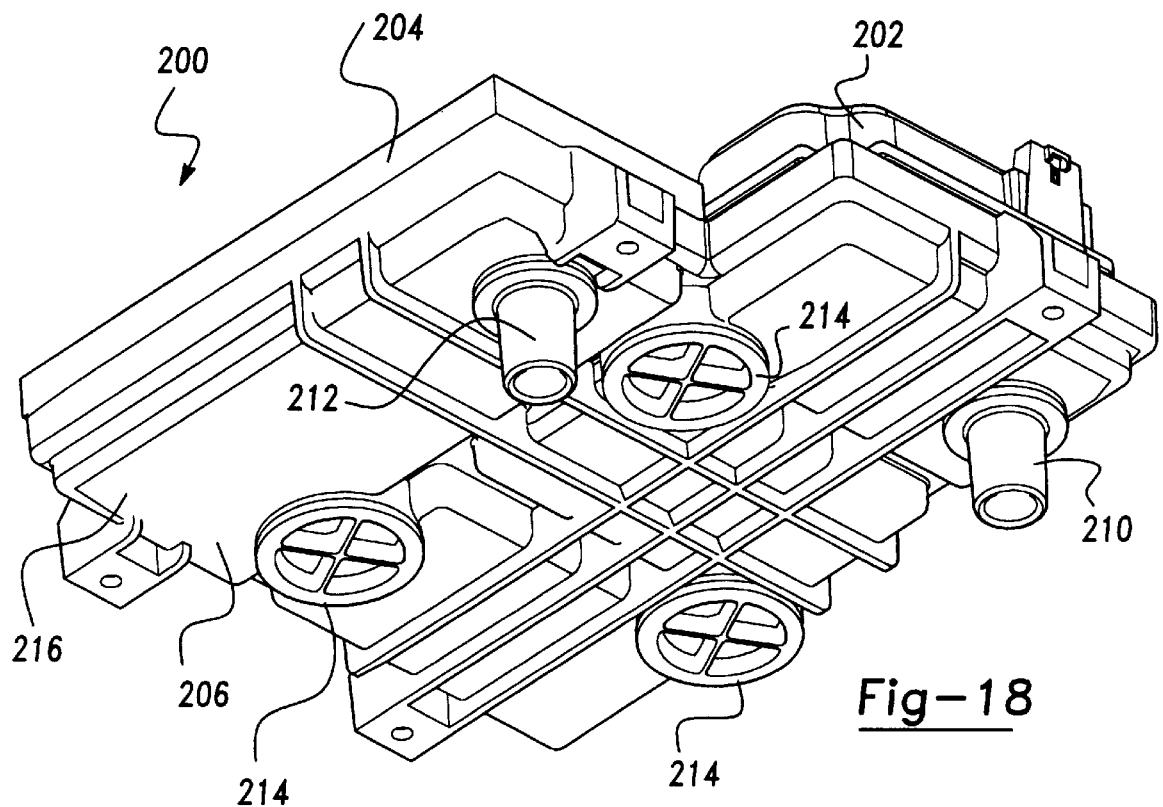
FIG. 18 is a bottom perspective view of the module shown in FIG. 17.

Now turning to FIGS. 17 and 18, a partial top perspective view and a bottom perspective view, respectively, is shown of a ganged power transistor module 200 including three ganged submodules 202 that house semiconductor devices (not shown) and other circuitry of the type discussed above. The module 200 is basically the same as the module 90, but includes a separate auxiliary coldplate 204. In this regard, the module 200 includes a heat-sink housing 206 including three chambers positioned directly below the submodules 202, and each having a baffle 208 identical to the baffles 146 discussed above. An inlet nipple to 210 introduces liquid coolant into the housing 206, and an exit nipple 212 allows the liquid coolant to be removed from the housing 206 as the liquid coolant is pumped through the housing 206. A plug 214 is provided at each location where the liquid coolant is transferred from one chamber to another. Thus, when the liquid coolant exits the final chamber including a baffle 208, it enters a housing portion 216 including another coolant chamber directly below the coldplate 204. In this embodiment, the chamber within the housing portion 216 does not include any type of baffle, but is merely an open chamber. The coldplate 204 allows other devices, such as DC—DC inverters, etc. that are lower power than the submodules 202 to be cooled by the same coolant system that cools the modules 202. Therefore, the liquid cooling system for an electric vehicle can be further reduced in size for a particular size constraints.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

The embodiments of the invention in which an exclusive property or privilege is claimed are defined as follows:

1. A liquid-cooled heat sink comprising:
   a cooling housing including at least one chamber, said at least one chamber including at least one wall that is to be cooled;
   a fluid inlet port in fluid communication with the housing;
   a fluid outlet port in fluid communication with the housing; and
   at least one baffle positioned within said chamber, said baffle including a horizontal dividing wall separating the chamber into a top chamber portion and a bottom chamber portion, said horizontal wall including at least one set of jet ports, said set of jet ports directing liquid coolant onto the at least one wall that is to be cooled, said baffle including at least one top dividing wall separating the top chamber portion into first and second top plenums, and at least one bottom dividing wall separating the bottom chamber portion into first and second bottom plenums, said horizontal wall further including at least one transfer port, wherein liquid coolant enters the bottom chamber portion through the fluid inlet port into the first bottom plenum and is forced into the first top plenum through the at least one set of jet ports to contact the at least one wall that is to be cooled, and flows from the first top plenum through the at least one transfer port to the second bottom plenum.

2. The heat sink according to claim 1 wherein the at least one set of jet ports is separated into first and second groups of jet ports where the first group is positioned on one side of the at least one transfer port and the second group is positioned on an opposite side of the transfer port.

3. The heat sink according to claim 2 wherein the at least one set of jet ports is a set of eight jet ports such that the first and second groups of jet ports are groups of four jet ports.

4. The heat sink according to claim 1 wherein each jet port in the at least one set of jet ports is a circular jet port having a diameter of about 0.20 inches.

5. The heat sink according to claim 1 wherein the at least one wall that is to be cooled is a substrate plate supporting a series of semiconductor devices, said at least one set of jet ports being a plurality of sets of jet ports where one set of jet ports being positioned directly below each semiconductor device.

6. The heat sink according to claim 1 wherein the baffle includes first, second and third sets of jet ports extending through the horizontal wall, two top dividing walls separating the top chamber portion into first, second and third top plenums, two bottom dividing walls separating the bottom chamber portion into first, second and third bottom plenums, and first, second and third transfer ports extending through the horizontal wall, wherein liquid coolant enters the bottom chamber portion through the fluid inlet port into the first bottom plenum and is forced through the first set of jet ports to contact the at least one wall that is to be cooled in the first top plenum, then flows from the first top plenum through the first transfer port into the second bottom plenum, then flows from the second bottom plenum through the second set of jet ports to contact the at least one wall that is to be cooled in the second top plenum, then flows from the second top plenum through the second transfer port to the third bottom plenum, then flows from the third bottom plenum through the third set of jet ports to contact the at least one wall that is to be cooled in the third top plenum, and then flows from the third top plenum through the third transfer port out of the fluid outlet port.

7. The heat sink according to claim 1 wherein the housing defines first, second and third chambers configured side-by-side and first, second and third baffles being positioned in each of the chambers, each of said baffles including a horizontal dividing wall separating the chamber into a top chamber portion and a bottom chamber portion, said horizontal wall including at least one set of jet ports, said at least one set of jet ports directing liquid coolant onto the at least one wall that is to be cooled, each baffle including at least one top dividing wall separating the top chamber portion into first and second top plenums, and at least one bottom dividing wall separating the bottom chamber portion into first and second bottom plenums, said horizontal wall further including at least one transfer port, wherein liquid coolant enters the bottom chamber portion through the fluid inlet port into the first bottom plenum and is forced through the at least one set of jet ports to contact the at least one wall that is to be cooled in the first top plenum, and flows from the first top plenum through the at least one transfer port to the second bottom plenum.

8. The heat sink according to claim 1 wherein the heat sink is included as part of an inverter module that converts DC voltage signals into AC voltage signals, said inverter module including a plurality of high power transistors that are to be cooled by the heat sink.

9. The heat sink according to claim 1 wherein the baffle is a single piece molded plastic unit.

10. The heat sink according to claim 1 wherein the housing includes a first chamber and a second chamber, said first chamber including the baffle and said second chamber having at least one wall defined by a coldplate.

11. The heat sink according to claim 1 wherein the at least one wall to be cooled is a metallic plate including a series of indentations.

12. An inverter module for converting DC voltage signals to AC voltage signals, said module comprising:
   a housing, said housing including at least one cover and at least one cooling chamber portion;

a fluid inlet port in fluid communication with the cooling chamber portion;

a fluid outlet port in fluid communication with the cooling chamber portion;

a substrate plate positioned within the housing, said substrate plate supporting a plurality of semiconductor devices, said substrate plate being a wall of the cooling chamber portion; and at least one baffle positioned within said cooling chamber portion, said baffle including a horizontal dividing wall separating the cooling chamber portion into a top cooling chamber portion and a bottom cooling chamber portion, said horizontal wall including at least one set of jet ports, said set of jet ports directing liquid coolant onto a backside of the plate opposite to the semiconductor devices, said baffle including at least one top dividing wall separating the top coolant chamber portion into first and second top plenums, and at least one bottom dividing wall separating the bottom coolant chamber into first and second bottom plenums, said horizontal wall further including at least one transfer port, wherein liquid coolant enters the bottom chamber portion through the fluid inlet port into the first bottom plenum and is forced into the first top plenum through the at least one set of jet ports to contact the plate, and flows from the first top plenum through the at least one transfer port to the second bottom plenum.

13. The inverter module according to claim 12 wherein the at least one set of jet ports is separated into first and second groups of jet ports where the first group is positioned on one side of the at least one transfer port and the second group is positioned on an opposite side of the transfer port.

14. The inverter module according to claim 12 wherein the baffle includes first, second and third sets of jet ports extending through the horizontal wall, two top dividing walls separating the top chamber portion into first, second and third top plenums, two bottom dividing walls separating the bottom chamber portion into first, second and third bottom plenums, and first, second and third transfer ports extending through the horizontal wall, wherein liquid coolant enters the bottom chamber portion through the fluid inlet port into the first bottom plenum and is forced through the first set of jet ports to contact the at least one wall that is to be cooled in the first top plenum, then flows from the first top plenum through the first transfer port into the second bottom plenum, then flows from the second bottom plenum through the second set of jet ports to contact the at least one wall that is to be cooled in the second top plenum, then flows from the second top plenum through the second transfer port to the third bottom plenum, then flows from the third bottom plenum through the third set of jet ports to contact the at least one wall that is to be cooled in the third top plenum, and then flows from the third top plenum through the third transfer port out of the fluid outlet port.

15. The inverter module according to claim 12 wherein the inverter module is a ganged inverter module including three submodules, each of said submodules including a plurality of semiconductor devices, said housing including first, second and third cooling chamber portions, said first cooling chamber portion being separated from the secured cooling chamber portion by a first dividing wall and said second cooling chamber portion being separated from the third cooling chamber portion by a second dividing wall, each of said submodules being positioned above one of the first, second or third cooling chamber portions, said first chamber including a first baffle, said second chamber including a second baffle, and said third chamber including a third baffle, wherein liquid coolant is introduced into the first cooling chamber portion through the inlet port, flows through the first baffle, flows from the first cooling chamber portion through a first side port in the first dividing wall into the second cooling chamber portion, flows through the second baffle in the second cooling chamber portion, flows from the second cooling chamber portion to the third cooling chamber portion through a second side port in the second dividing wall, flows through the third baffle in the third cooling chamber portion, and flows from the third cooling chamber portion out of the fluid outlet port.

16. The inverter module according to claim 12 wherein the housing defines first, second and third chambers configured side-by-side and first, second and third baffles being positioned in each of the chambers, each of said baffles including a horizontal dividing wall separating the chamber into a top chamber portion and a bottom chamber portion, said horizontal wall including at least one set of jet ports, said at least one set of jet ports directing liquid coolant onto the at least one wall that is to be cooled, each baffle including at least one top dividing wall separating the top chamber portion into first and second top plenums, and at least one bottom dividing wall separating the bottom chamber portion into first and second bottom plenums, said horizontal wall further including at least one transfer port, wherein liquid coolant enters the bottom chamber portion through the fluid inlet port into the first bottom plenum and is forced through the at least one set of jet ports to contact the at least one wall that is to be cooled in the first top plenum, and flows from the first top plenum through the at least one transfer port to the second bottom plenum.

17. A liquid-cooled heat sink comprising:

a cooling chamber, said cooling chamber including a wall to be cooled;

a fluid inlet port in fluid communication with the cooling chamber;

a fluid outlet port in fluid communication with the chamber; and a baffle positioned within the chamber, said baffle including a horizontal dividing wall separating the chamber into a top chamber portion and a bottom chamber portion, said horizontal wall including first, second and third sets of eight jet ports, each of said set of jet ports directing liquid coolant onto the wall to be cooled, said baffle further including two top dividing walls separating the top chamber portion into first, second and third top plenums, two bottom dividing walls separating the bottom chamber portion into first, second and third bottom plenums, and first, second and third transfer ports extending through the horizontal wall, wherein liquid coolant enters the bottom chamber portion through the fluid inlet port into the first bottom plenum and is forced through the first set of jet ports to contact the wall to be cooled in the first top plenum, then flows from the first top plenum through the first transfer port into the second bottom plenum, then flows from the second bottom plenum through the second set of jet ports to contact the wall to be cooled in the second top plenum, then flows from the second top plenum through the second transfer port to the third bottom plenum, then flows from the third bottom plenum through the third set of jet ports to contact the wall to be cooled in the third top plenum, and then flows from the third top plenum through the third transfer port out of the fluid outlet port.

18. The heat sink according to claim 17, wherein each jet port is a circular jet port having a diameter of about 0.20 inches.

* * * * *